United States Patent [19]
Smith et al.

[11] Patent Number: 5,766,367
[45] Date of Patent: Jun. 16, 1998

[54] METHOD FOR PREVENTING MICROMECHANICAL STRUCTURES FROM ADHERING TO ANOTHER OBJECT

[75] Inventors: James H. Smith; Antonio J. Ricco, both of Albuquerque, N. Mex.

[73] Assignee: Sandia Corporation, Albuquerque, N. Mex.

[21] Appl. No.: 645,976

[22] Filed: May 14, 1996

[51] Int. Cl.$^6$ .................................................. C23G 1/00
[52] U.S. Cl. ........................... 134/2; 134/26; 216/2
[58] Field of Search .......................... 134/1.3, 2, 3, 26; 216/99, 109, 2

[56] References Cited

U.S. PATENT DOCUMENTS

| | | | |
|---|---|---|---|
| 4,908,805 | 3/1990 | Sprenkels et al. | 367/181 |
| 4,910,840 | 3/1990 | Sprenkels et al. | 29/25.41 |
| 5,318,928 | 6/1994 | Gegenwart et al. | 437/235 |
| 5,332,444 | 7/1994 | George et al. | 134/2 |
| 5,603,849 | 2/1997 | Li | 216/99 |

*Primary Examiner*—Ivars Cintins
*Attorney, Agent, or Firm*—Elmer Klavetter; Timothy D. Stanley

[57] ABSTRACT

A method for preventing micromechanical structures from adhering to another object includes the step of immersing a micromechanical structure and its associated substrate in a chemical species that does not stick to itself. The method can be employed during the manufacture of micromechanical structures to prevent micromechanical parts from sticking or adhering to one another and their associated substrate surface.

21 Claims, 3 Drawing Sheets

METHOD FOR PREVENTING MICROMECHANICAL STRUCTURES FROM ADHERING TO ANOTHER OBJECT

GOVERNMENT RIGHTS

This invention was made with United States Government support under Contract No. DE-AC04-76DP00789 awarded by the U.S. Department of Energy. The Government has certain rights in this invention.

BACKGROUND OF THE INVENTION

The present invention relates generally to the field of surface passivation of micromechanical structures formed on semiconductor, ceramic, oxide or metal substrates. More particularly, the present invention relates to a technique for preventing the undesirable adhesion of micromechanical structures to one another or to a substrate due to static friction (i.e. stiction).

Many micromechanical structures manufactured today rely upon semiconductor etching techniques. The same techniques utilized in the electronics industry to develop integrated circuits also permit manufacturers to create a wide variety of miniaturized mechanical devices, including sensors such as accelerometers, microphones, analytical chemical systems, flow sensors, combustion sensors, and bolometers. Other micromachined devices developed by traditional semiconductor manufacturing techniques include actuators used as weapon surety devices and valves employed in flow control systems.

Manufacture of micromechanical structures using typical semiconductor processing technology involves the patterning and deposition of structural layers of polycrystalline silicon (polysilicon), metal or silicon nitride on a semiconductor substrate. Sacrificial layers of silicon dioxide, polymer or metal can also be deposited and patterned on the semiconductor wafer, allowing for the formation of composite micromechanical structures. These sacrificial layers can be subsequently dissolved during an etching process, leaving the structural layers and the supporting substrate intact. The remaining micromechanical structures can rotate or translate, depending upon the design and intent of the original structural pattern.

Unfortunately, the chemistries designed to release adjacent structural parts by dissolving the sacrificial layers can also cause unwanted adhesion between released adjacent structural parts or between such structural parts and the supporting substrate. The undesired adhesion or stiction that results from the use of such wet release chemistries poses a serious barrier to the manufacturing of effective micromechanical structures. When micromechanical structures touch, their extremely flat surfaces, small scales, mechanical flexibility, and the tendency for direct chemical bonding between contacting surfaces make it difficult to separate these micromechanical structures. When the micromechanical structures stick, the resulting micromechanical device is no longer functional.

Various methods have been developed for the chemical passivation of semiconductor device surfaces. One method that has been developed for the passivation of micromechanical device surfaces is described in U.S. Pat. No. 5,318,928 to Gegenwart et al. The method of Gegenwart et al. calls for introducing an inert gas into a tank where a high frequency energy source is applied to internal electrodes for the ignition of a plasma within the tank. The micromechanical device surfaces are cleaned by sputtering away impurities from the surface by means of plasma particles striking the surface. Such a method is necessarily expensive due to the use of plasma enhanced depositions on the micromechanical devices, unlike the present invention which involves a simple and inexpensive wet chemical treatment process, which also avoids the harmful effects to humans and animals associated with plasma etching.

Other methods for semiconductor surface passivation include those shown in U.S. Pat No. 4,910,840 and U.S. Pat. No. 4,908,805 to Sprenkels et al. The Sprenkels et al. patents provide for an electrical passivation method that is unlike the chemical surface passivation method disclosed in the present invention.

Still other methods use less effective or more expensive passivation techniques such as supercritical carbon dioxide drying or foregoing the use of a non-stick release mechanism. Foregoing the use of non-stick release mechanisms in particular results in often severe yield problems. Carbon dioxide drying, in particular, involves the high pressure, super critical transition of carbon dioxide from a liquid to a gas phase. In such circumstances, costly and dangerous high pressure vessels and cryogenic liquids must be utilized to complete the passivation of a semiconductor surface.

The present method of preventing micromechanical devices from adhering to another object offers many advantages over existing technologies. One advantage of the present invention is that cumbersome and potentially hazardous plasma devices are not required, thereby reducing the passivation method to a simple, yet unique and inexpensive, wet chemical passivation method. The present invention provides a method which enhances throughput, safety and economy over existing technologies.

SUMMARY OF THE INVENTION

A method for preventing micromechanical structures from adhering to another object. The present invention comprises a wet chemical treatment process in combination with conventional integrated circuit processing techniques. Initially, unreleased micromechanical structures, along with the substrate upon which the micromechanical structures are located are immersed in an etching agent so that the micromechanical structures can be released from one another and/or from the substrate by any supporting sacrificial layers. Subsequently, the substrate and micromechanical structures are rinsed with deionized water, thereby removing the etching agent along with any dissolved sacrificial layer material. The water can then be displaced by immersing the substrate and any micromechanical structures in alcohol. The alcohol can then be displaced by immersing the substrate and the micromechanical structures in an organic solvent, and adding hexamethyldisilazane ("HMDS") to the solvent.

Further scope of applicability of the present invention will become apparent from the detailed description of the invention provided hereinafter. It should be understood, however, that the detailed description of the invention and the specific example presented, while indicating an embodiment of the present invention, is provided for illustration purposes only because various changes and modifications within the spirit and scope of the invention will become apparent to those of ordinary skill in the art from the detailed description of the invention and claims that follow.

BRIEF DESCRIPTION OF THE DRAWINGS

The manner in which the above recited features and advantages of the present invention are attained are illustrated in the appended drawings.

DETAILED DESCRIPTION OF THE INVENTION

The present invention provides a method for preventing the undesirable adhesion of micromechanical structures to one another or to a substrate. The method of the present invention can be accomplished by immersing released micromechanical structures and the associated substrate on which the micromechanical structures were formed, into a liquid selected from a class of liquids that have the property of reacting chemically with the surfaces of the micromechanical structures and their associated substrate so as to form a layer of a surface-attached inert chemical functional group. One such inert chemical functional group is the trimethylsilyl group. Such inert chemical functional groups do not form strong chemical bonds with like functional groups upon simple direct contact.

Hexamethyldisilazane is an example of a liquid selected from an inert chemical functional group. When hexamethyldisilazane is applied to a substrate and micromechanical structures, a thin film forms, approximately one molecular monolayer in thickness, which terminates in methyl groups that point away from the surfaces of the substrate and micromechanical structures. Methyl groups do not bond well to other methyl groups nor to other chemical and surface functional sites. When the surfaces of two separate micromechanical structures are coated with a monolayer that terminates in methyl groups and are subsequently placed together, the micromechanical structures will not stick to one another under ordinary ambient conditions.

Figure 1:
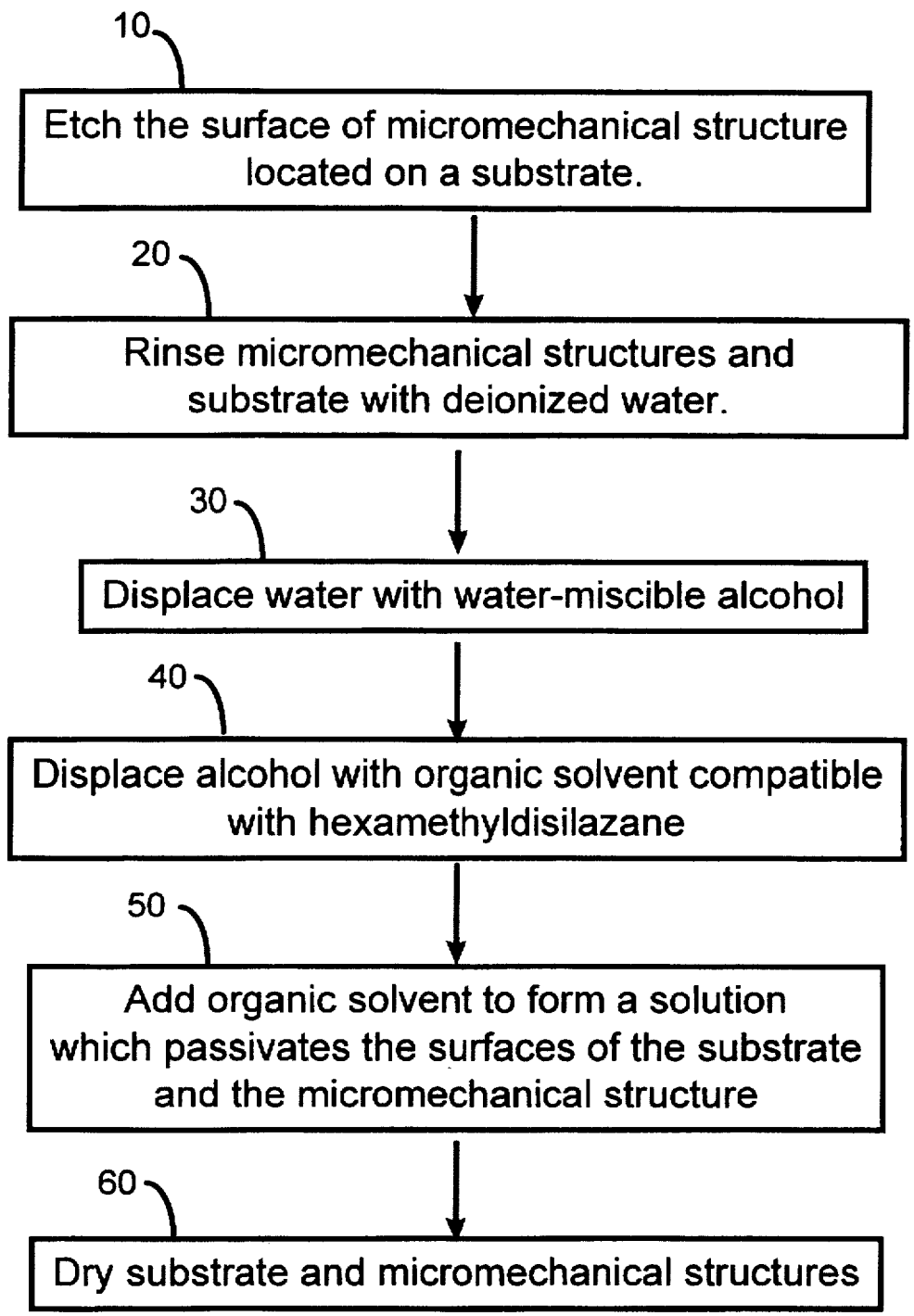
FIG. 1 depicts the method steps of the present invention.

A first embodiment of the present invention is shown in FIG. 1. In a first step 10, unreleased micromechanical structures formed on a substrate are etched with a hydrofluoric acid based etchant so as to release the micromechanical structures. In a second step 20, the micromechanical structures and the substrate are rinsed with deionized water. In a third step 30, the deionized water is displaced with a water-miscible alcohol. In a fourth step 40, the alcohol is displaced with an organic solvent. The organic solvent is compatible with a liquid derived from an inert chemical functional group such as the trimethylsilyl group. In a fifth step 50, a liquid derived from an inert chemical functional group such as the trimethylsilyl group is added to the organic solvent to form a solution which forms a layer on the surface of the micromechanical structures so as to passivates the surface of the micromechanical structures and their associated substrate. A sixth step 60 includes drying of the substrate and the micromechanical structures. The method according to the present invention, however, is not limited to this particular sequence of steps.

The method disclosed in the present invention can apply to micromechanical structures derived from polysilicon or silicon nitride and which further include sacrificial elements. Such sacrificial elements can be oxide sacrificial elements. Given a substrate with these micromechanical structures, a release can be accomplished by etching the sacrificial oxide elements and associated sacrificial layers with an appropriate etchant such as hydrofluoric acid, hydrofluoric acid buffered with ammonium fluoride, a diluted hydrofluoric acid solution, or mixtures of hydrofluoric acid and other acids such as hydrochloric acid. A dihydroxy alcohol such as ethylene glycol can also be added to this etch.

Upon completion of this initial release step, the substrate and structural elements can be rinsed thoroughly with deionized water. A hydrophilic surface can then be formed by rinsing the substrate and the micromechanical structural elements with a diluted aqueous ammonia solution. The reaction of the diluted aqueous ammonia solution with the substrate forms the hydrophilic surface. After the formation of the hydrophilic surface, a secondary rinse of the substrate and structural elements can be performed with deionized water. The deionized water can be subsequently displaced with a water-miscible alcohol such as isopropanol, ethanol or methanol.

The alcohol can then be displaced with an organic solvent such as acetone that is compatible with trimethylsilyl. The organic solvent can be a mixture of toluene, heptane, octane, trichloroethylene or other solvents compatible with hexamethyldisilazane and also miscible with the selected alcohol. Hexamethyldisilazane is then be added to the aforementioned solvent to passivate the surface of the substrate and the structural elements that comprise a micromechanical device. The addition of hexamethyldisilazane to the solvent can result in the generation of ammonia gas which assists in the overall release process. The gas pressure of the ammonia gas also serves to push the structures apart and away from the substrate. Adding hexamethyldisilazane serves to completely displace the organic solvent and prepare the substrate and micromechanical surfaces for drying. Drying can be accomplished by utilizing any of a number of drying techniques such as air drying of the substrate and micromechanical structures in a sterile clean environment or using a convection oven or a hotplate. The process of coating all surfaces with a layer of firmly chemically bound trimethylsilyl groups begins when the hexamethyldisilazane is first added to displace the organic solvent and can continue up until the completion of the drying process wherein the remaining hexamethyldisilazane is removed from the substrate and any mechanical parts.

Figure 2:
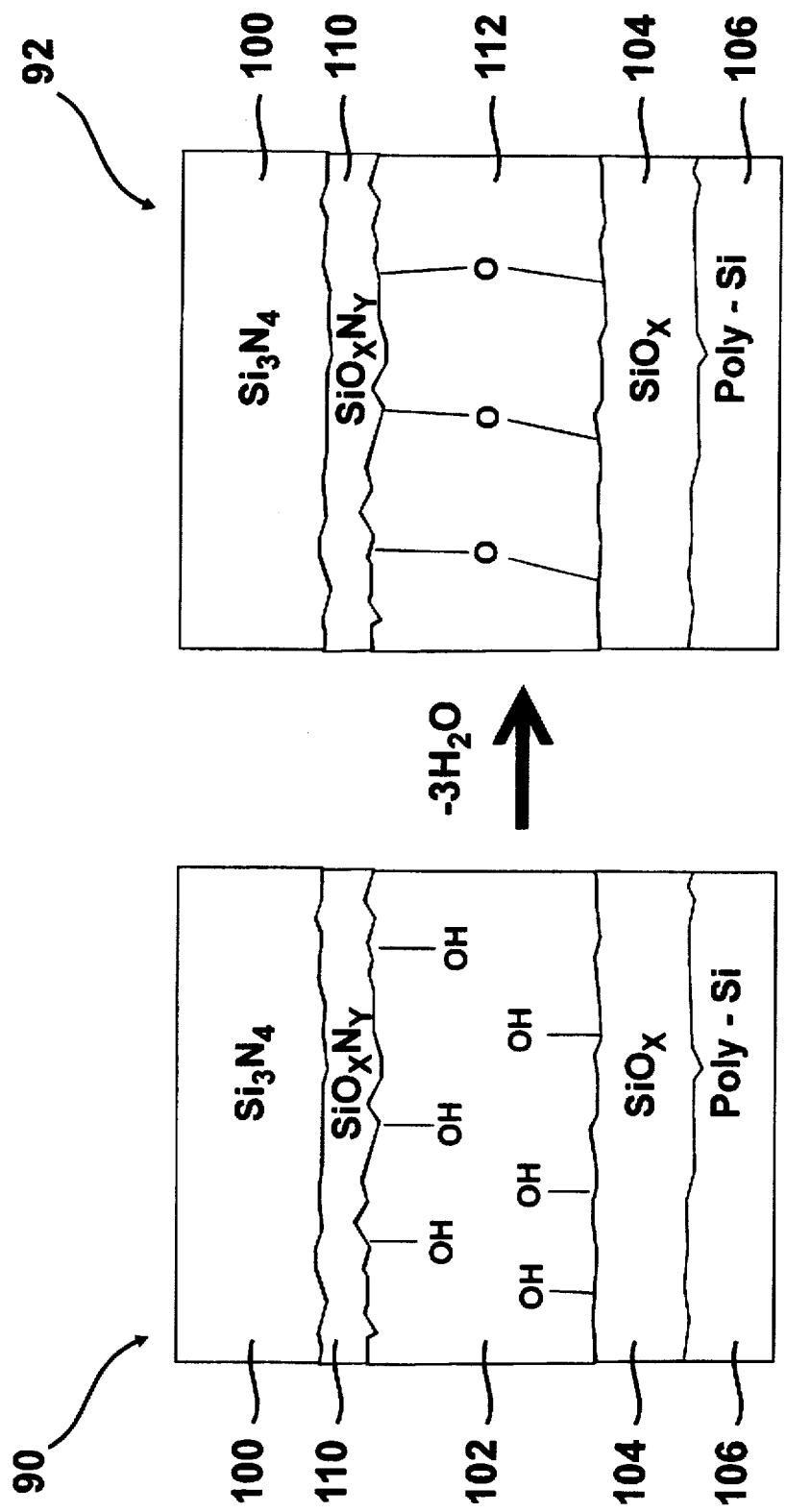
FIG. 2 depicts the formation of undesirable strong bonds between structural layers.
Figure 3:
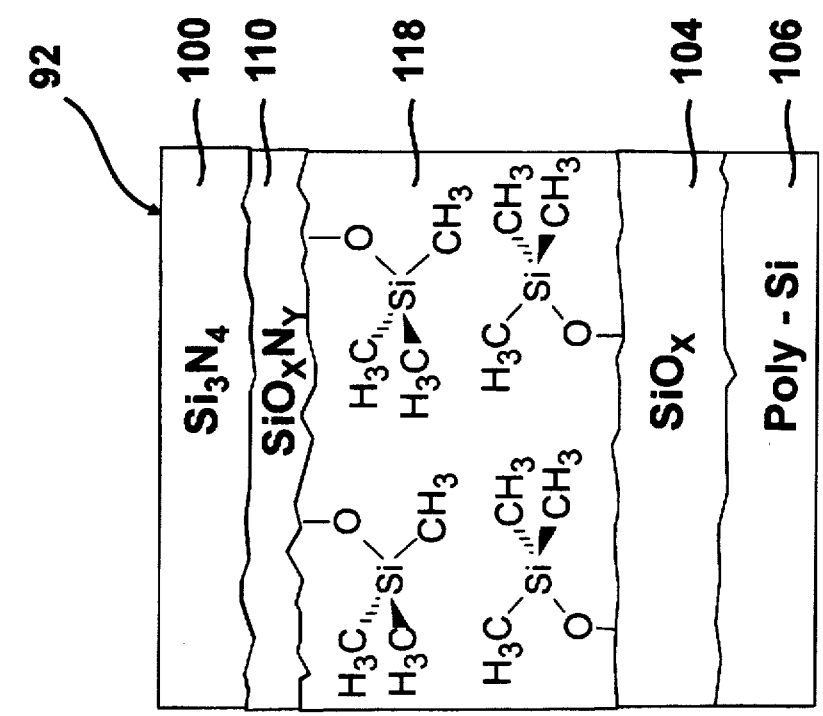
FIG. 3 depicts a treatment for preventing the formation of undesirable strong bonds between structural layers.
Figure 3:
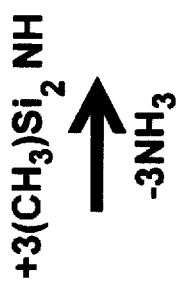
Figure 3:
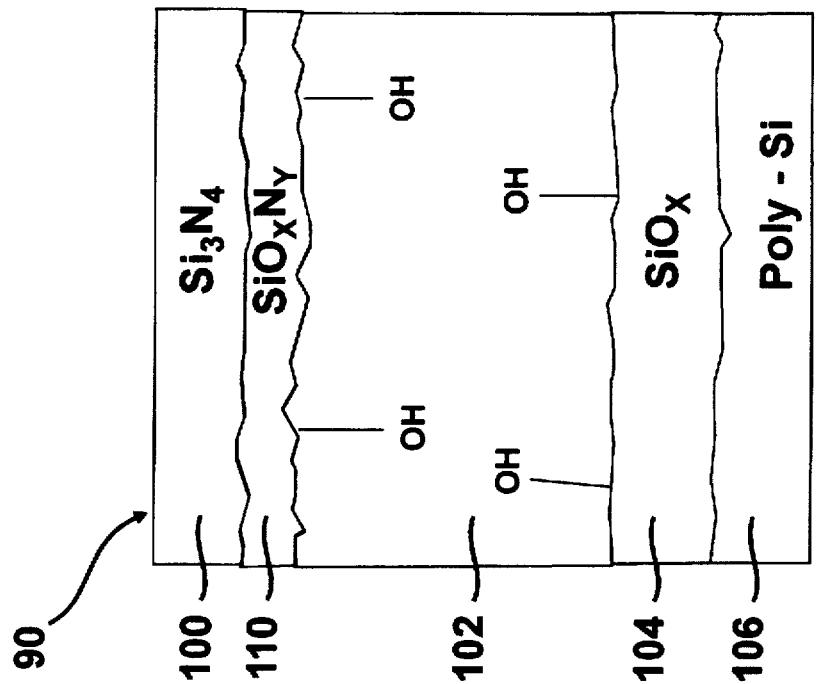

FIG. 2 and FIG. 3 depict a second embodiment of the present invention in which several chemical reactions serve to release micromechanical structures from an associated substrate. Generally, when micromechanical structures are released in hydrofluoric acid and then rinsed in $H_2O$, the micromechanical structures stick together when the $H_2O$ dries due to bonding of oxide or nitride to polysilicon, other oxides, nitrides or other silicon based structures. Micromechanical structural surfaces 90 include an $Si_3N_4$ layer 100, an $SiO_xN_y$ layer 110, a hydroxide layer 102, a $SiO_x$ layer 104 and a polysilicon layer 106. $H_2O$ is removed from micromechanical structural surfaces 90 by drying. Removal of $H_2O$ modifies the micromechanical structural surfaces 90 to form micromechanical structural surfaces 92, which now include a layer of strong covalent bonds 112. To avoid the formation of a layer of strong covalent bonds 112, the micromechanical structural surfaces 90 should instead be treated with hexamethyldisilazane as shown in FIG. 3. A reaction of hexamethyldisilazane with micromechanical structural surfaces 90 forms layers 96 which now include a non-bonded layer 118.

Although the present invention has been shown and described with respect to one embodiment, various changes and other modifications which are obvious to persons skilled in the art to which the invention pertains are deemed to lie within the spirit and scope of the invention.

We claim:

1. A method for preventing a micromechanical structure on an associated substrate on which the micromechanical structure was formed from adhering to another object, comprising the steps of:

immersing in an organic solvent a micromechanical structure and an object that touches said micromechanical structure; and adding to said solvent a liquid having the property of forming a layer of a surface-attached inert chemical functional group to the surfaces of the micromechanical structure.

2. The method according to claim 1, wherein said liquid comprises an organic or organometallic compound with a trimethylsilyl chemical functional group.

3. The method according to claim 2 wherein said liquid is hexamethyldisilazane.

4. The method according to claim 1 wherein the micromechanical structure and said object are separated from one another by sacrificial elements.

5. The method according to claim 4 wherein said object comprises another micromechanical structure.

6. The method according to claim 5 further comprising the steps of:

immersing in an etching agent the micromechanical structure, the associated substrate, and sacrificial elements;

rinsing the substrate and the micromechanical structure with deionized water;

displacing the water with alcohol;

displacing the alcohol with an organic solvent.

7. The method according to claim 6 wherein the sacrificial elements comprise silicon oxide sacrificial elements.

8. The method according to claim 6 wherein said liquid is hexamethyldisilazane.

9. The method according to claim 8 wherein the organic solvent has the property of forming a miscible solution with hexamethyldisilazane.

10. The method according to claim 9 wherein the organic solvent comprises acetone.

11. The method according to claim 9 wherein the organic solvent comprises toluene.

12. The method according to claim 9 wherein the organic solvent comprises heptane.

13. The method according to claim 9 wherein the organic solvent comprises octane.

14. The method according to claim 8 wherein the step of adding hexamethyldisilazane to the solvent generates a gas which assists in releasing the micromechanical structures from the substrate.

15. The method according to claim 8 further comprising the step of air drying the micromechanical structures and the substrate in a clean environment to remove said hexamethyldisilazane and said solvent.

16. The method according to claim 8 further comprising the step of forming a hydrophilic surface coating on the substrate, the structures and the sacrificial elements.

17. The method according to claim 16 further comprising the step of forming the hydrophilic surface coating on the substrate, the structures and the sacrificial elements by rinsing the substrate, the structures and the sacrificial elements with a dilute aqueous ammonia chemical solution.

18. The method according to claim 16 wherein the step of forming a hydrophilic surface coating on the substrate and the micromechanical structures occurs prior to the step of adding hexamethyldisilazane to the solvent.

19. The method according to claim 8 further comprising the step of adding hexamethyldisilazane to the organic solvent which serves to completely displace the organic solvent.

20. The method according to claim 8 wherein the micromechanical structures further comprise silicon nitride.

21. The method according to claim 8 wherein the micromechanical structures further comprise polysilicon.

* * * * *